(12) United States Patent
Reed

(10) Patent No.: US 7,474,569 B2
(45) Date of Patent: Jan. 6, 2009

(54) TWO-ELEMENT MAGNETIC MEMORY CELL

(75) Inventor: Daniel S. Reed, Maple Plain, MN (US)

(73) Assignee: Honeywell International Inc., Morristown, NJ (US)

( * ) Notice: Subject to any disclaimer, the term of this patent is extended or adjusted under 35 U.S.C. 154(b) by 144 days.

(21) Appl. No.: 11/440,966

(22) Filed: May 25, 2006

(65) Prior Publication Data

US 2007/0272036 A1 Nov. 29, 2007

(51) Int. Cl.
*G11C 7/00* (2006.01)
(52) U.S. Cl. .................. 365/189.07; 365/158; 365/207
(58) Field of Classification Search .............. 365/158, 365/189.07, 205, 207
See application file for complete search history.

(56) References Cited

U.S. PATENT DOCUMENTS

| | | | |
|---|---|---|---|
| 5,756,366 | A | 5/1998 | Berg |
| 6,147,922 | A | 11/2000 | Hurst |
| 6,175,525 | B1 | 1/2001 | Fulkerson |
| 6,178,111 | B1 | 1/2001 | Sather |
| 6,455,177 | B1 | 9/2002 | Everitt |
| 6,493,258 | B1 | 12/2002 | Lu |
| 6,549,455 | B2 * | 4/2003 | Yamada ........................ 365/158 |
| 6,584,011 | B2 * | 6/2003 | Watanabe .................... 365/158 |
| 6,930,911 | B2 * | 8/2005 | Ezaki et al. .................. 365/158 |
| 7,286,392 | B2 * | 10/2007 | Boeve ......................... 365/158 |

OTHER PUBLICATIONS

U.S. Appl. No. 11/448,547, filed Jun. 2006, Romney R. Katti.*
U.S. Appl. No. 11/409,371, filed Apr. 2006, Romney R. Katti.*
U.S. Appl. No. 11/376,433, filed Mar. 2006, Romney R. Katti.*
Hong et al., "Magnetic element Shape for Magnetic Random Access Memory (MRAM)", (May 28-29, 2003).
Daughton, "Magnetoresistive Random Access Memory (MRAM)," pp. 1-13 (Feb. 4, 2000).
Hertel, "Thickness Dependence of Magnetization Structures in Thin Permalloy Rectangles", Max-Planck-Institut fur Mikrostrukturphysik, Weinberg 2, 06120 Halle, Germany.
Slaughter, "Magnetic Tunnel Junction Materials for Electronic Applications,"JOM (Jun. 2000).

* cited by examiner

*Primary Examiner*—Hoai V Ho
(74) *Attorney, Agent, or Firm*—McDonnell Boehnen Hulbert & Berghoff LLP

(57) ABSTRACT

A magnetic memory cell that includes at least two magnetoresistive memory bits is presented. The memory cell is capable of storing at least two logical states. The first logical state occurs when the bits share the same orientation, such as a parallel orientation or an antiparallel orientation. The second logical state occurs when the bits have opposite orientations. In the second logical state one of the bits has a parallel orientation and the other bit has an antiparallel orientation.

14 Claims, 7 Drawing Sheets

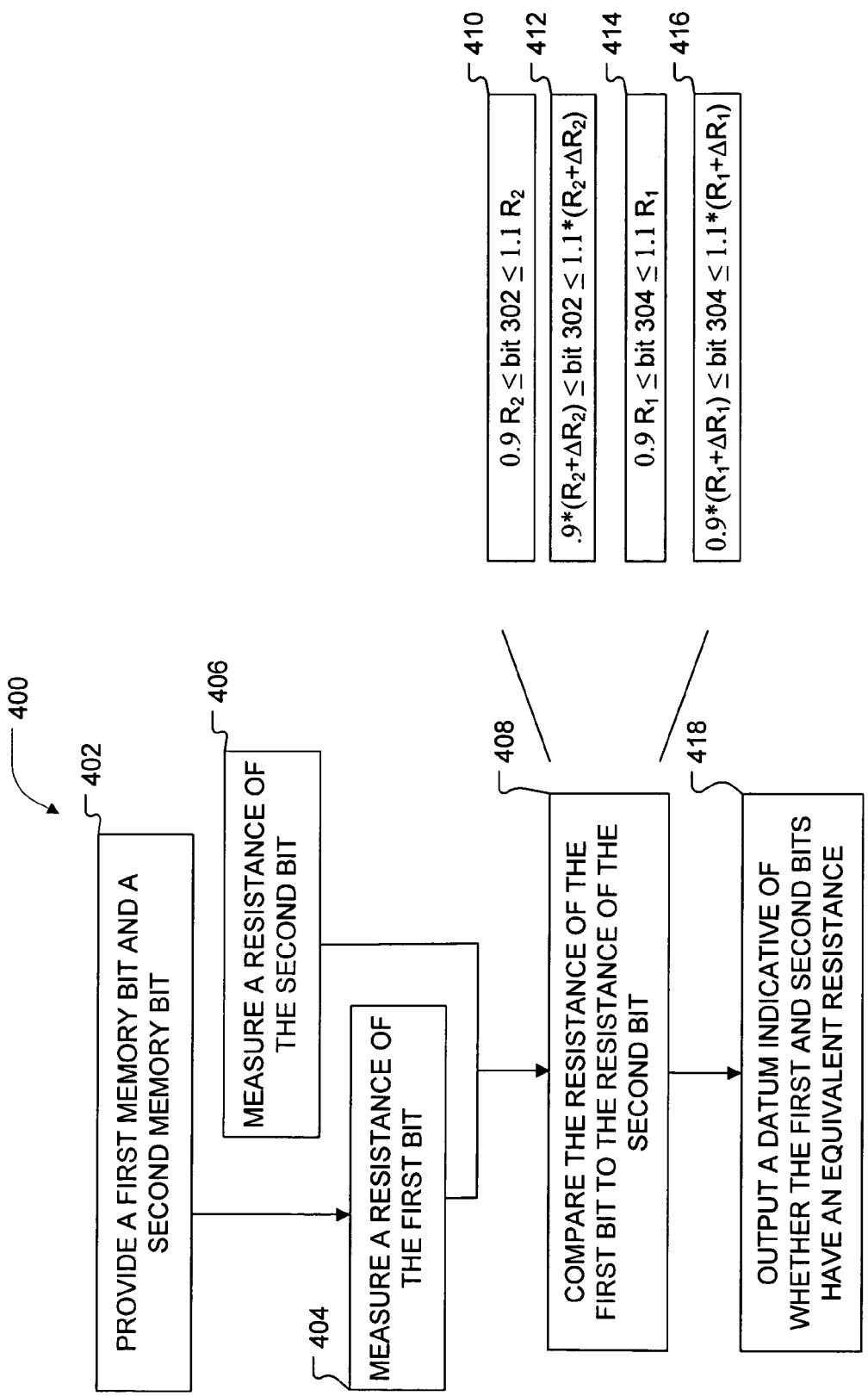

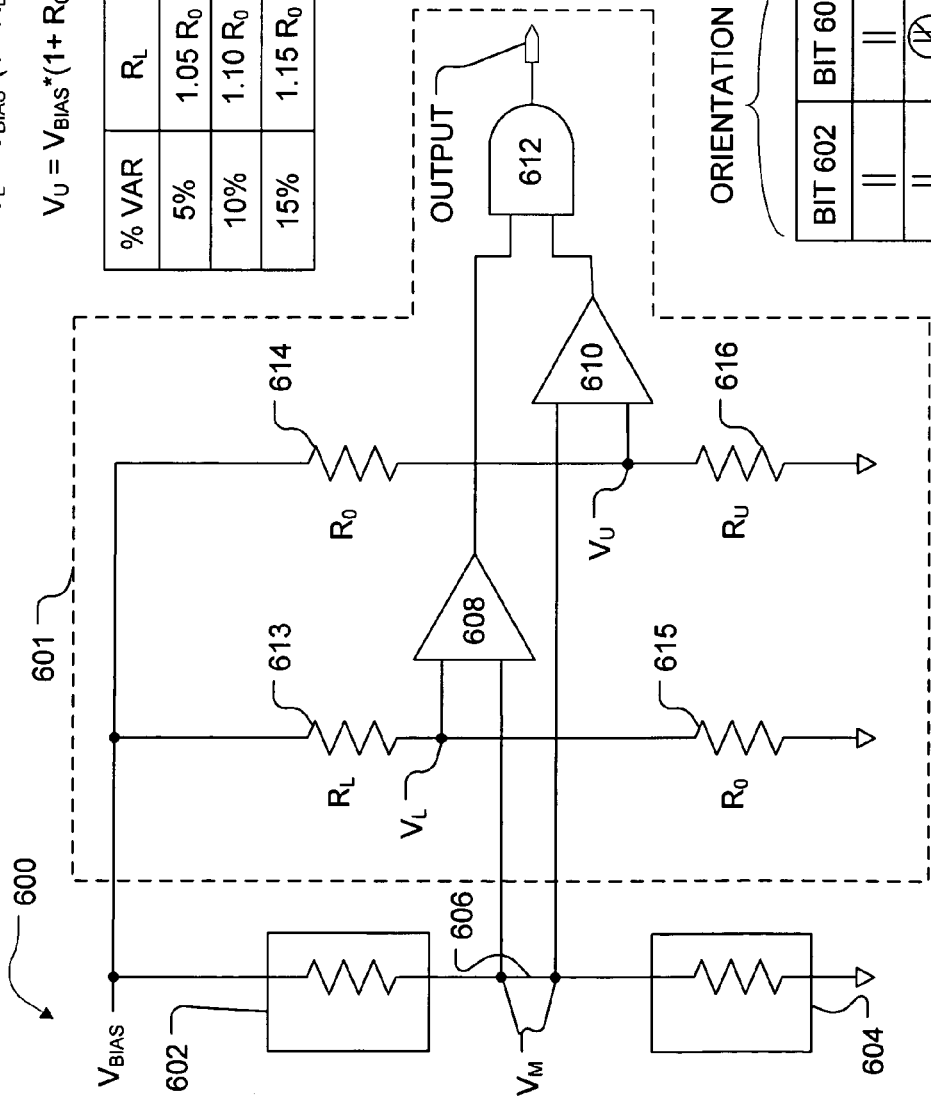
FIG. 7A
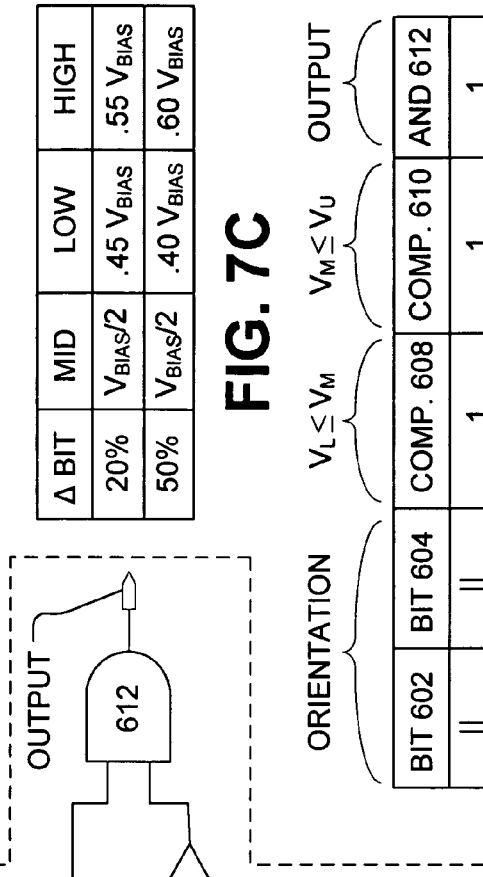
FIG. 7B
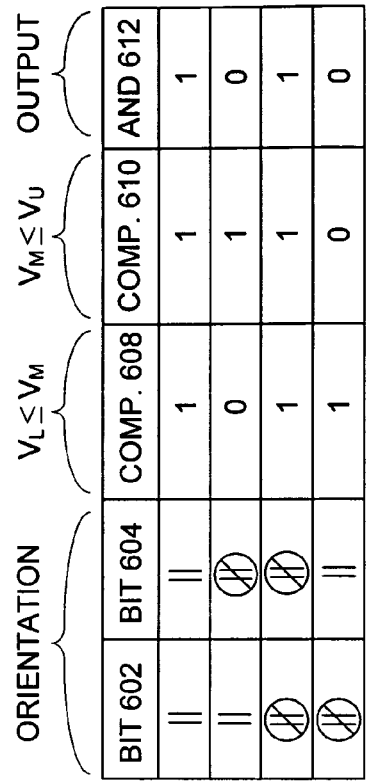
FIG. 7C
FIG. 7D

TWO-ELEMENT MAGNETIC MEMORY CELL

GOVERNMENT RIGHTS

The United States Government may have acquired certain rights in this invention pursuant to Contract No. DTRA01-00-C-0002 awarded by the Defense Threat Reduction Agency (DTRA).

FIELD

The invention relates to nonvolatile memories and more particularly to a magnetic memory cell that includes more than one memory bit for data storage.

BACKGROUND

The discovery of the giant magnetoresistive (GMR) effect has led to the development of a number of spin-based electronic devices. The GMR effect is observed in certain thin-film devices that are made up of alternating ferromagnetic and nonmagnetic layers. In a typical device, the relative orientations of magnetic directions of the ferromagnetic layers define a binary state of the device. The resistance across a device is generally lowest when the magnetic directions of the ferromagnetic layers are in a parallel orientation and highest when the magnetic directions are in an antiparallel orientation. In a related device, the magnetic tunnel junction (MTJ), the nonmagnetic metal layer is replaced by a thin insulating layer. The tunneling current through this insulating layer can also be measured as a resistance that changes depending on the relative magnetization state of the two layers. The MTJ device generally produces a much larger resistance change than the GMR device.

One type of GMR device is commonly referred to as a "spin valve." GMR devices, including spin valves, can be used as data storage elements in magnetic random access memory (MRAM) devices. In this regard, exemplary MRAM applications of GMR devices are described in U.S. Pat. Nos. 6,147,922; 6,175,525; 6,178,111; 6,493,258, and U.S. Pat. App. Pub. No. 2005/0226064, all of which are incorporated herein by reference.

A spin valve or an MTJ device typically includes two or more ferromagnetic layers that are separated by a thin layer of a non-magnetic material (either a metal or insulator) and also includes an antiferromagnetic layer that "pins" the magnetization direction of one of the ferromagnetic layers. FIG. 1A illustrates (in a simplified form) the layers in a typical spin valve 10 as seen from a side view. As shown in FIG. 1A, the spin valve 10 includes ferromagnetic layers 12 and 14 separated by a nonmagnetic layer 16. In a typical arrangement, one of the magnetic layers is configured to be a fixed layer 14. The fixed layer 14 is adjacent to an anti-ferromagnetic layer 18, such that the magnetization direction of the fixed layer 14 is "pinned" in a particular orientation. The arrow in the fixed layer 14 indicates an exemplary pinned orientation, though, in general, the orientation could be pinned in either direction. Thus, the magnetization direction of the fixed layer 14 remains relatively fixed when operational magnetic fields are applied to spin valve 10. A second magnetic layer 12 is termed a free layer 12. In contrast with the fixed layer 14, the magnetization direction of the free layer 12 is free to switch between parallel and antiparallel orientations, as indicated by the double-arrow symbol in the free layer 12. By applying an appropriate magnetic field to the spin valve 10, the magnetization direction of the free layer 12 can be inverted while the magnetization direction of the fixed layer 14 remains the same.

FIG. 1B shows a three-dimensional view of the spin valve 10 of FIG. 1A. As shown, the spin valve 10 has a hard-axis (short-axis) and an easy-axis (long-axis). In the absence of an applied magnetic field, the magnetization directions of both the free layer 12 and the fixed layer 14 run substantially parallel to the easy-axis.

Typically, a magnetic memory, such as a magnetic random access memory (MRAM) or a magnetic read only memory (MROM), comprises memory cells that include a GMR or MTJ based memory bit. To determine a logical state of a particular memory cell within a magnetic memory, the magnetic memory will include a pair of pre-set reference elements that are used in comparison with a particular memory cell's memory bit. If the resistance measurement of the memory bit is below an average resistance of the pre-set reference elements, the memory cell is in a first binary state (e.g., a binary value of "0"). On the other hand, if the memory bit is above the average resistance, the memory cell is an opposite binary state, (e.g., a binary value of "1"). This manner of reading and writing a memory cell is generally referred to as a high/low scheme.

In general, the pre-set reference elements need to be set during manufacturing. If the reference elements are set incorrectly, or if the resistance of a particular memory cell's memory bit changes over time, a memory cell may fail to properly store data and thus become unusable.

SUMMARY

A magnetic memory cell and a method of operation are presented. The memory cell may comprise first and second magnetoresistive memory bits that are configured to be written and read so that when the first and second bits have an equivalent resistance value, the memory cell is interpreted as being in a first logical state, and when the first and second resistive elements have a non-equivalent resistance value, the memory cell is interpreted as being in a second logical state. The first and second bits, for example, may be magnetic tunneling junction devices (MTJs).

In one example, a memory cell may include a comparator that outputs a signal indicative of at least one of the first and second logical states. In an alternative example, the comparator may be shared by multiple memory cells.

In another example, the equivalent resistance value includes a range of resistances. An example of the range of resistances may include ±10% of a maximum resistance measurement of at least one of the first and second bits and ±10% of a minimum resistance measurement of at least one of the first and second bits.

An example method of determining a logic state of a memory cell is also described. The example method includes providing a memory cell that includes a first magnetoresistive memory bit and a second magnetoresistive memory bit; determining whether the first bit and the second bit share the same orientation; and outputting a datum indicative of whether the first bit and the second bit share the same orientation.

In this regard, determining whether the first bit and the second bit share the same orientation may comprise measuring a resistance of the first bit and a resistance of the second bit and comparing the resistance of the first bit to the resistance of the second bit.

In another example, when writing a memory cell, an applied magnetic field may be used to change the resistance value of the first bit and/or the second bit. The first and second bits may be changed so that they have the same orientations, or opposite orientations.

In another example, a memory may be comprised of multiple memory cells. Comparative logic may be located within an individual memory cell, or multiple memory cells may share the comparative logic. The comparative logic, for example, may be configured to determine a logical state of at least two bits within a memory cell by measuring a voltage at a node where the two bits are coupled together. Moreover, the comparative logic may determine if a voltage at the node is within an equivalent voltage range.

Example comparative logic may include a first comparator having first and second inputs respectively coupled to the node and a third voltage bias, a second comparator having first and second inputs respectively coupled to the node and a fourth voltage bias, and a logical AND gate having first and second inputs coupled to outputs of the first and second comparators. The AND gate, in one example, may be used to output a binary datum indicative of whether the voltage at the node is within a range established by the third and fourth voltage biases. The third and fourth voltages may be established by respective first and second voltage dividers.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

FIG. 5A is a flow diagram of a method of determining a logical state of a magnetic memory cell that comprises two memory bits, according to an example;

FIG. 5B is a block diagram of several equivalent resistance ranges, according to an example;

FIG. 7A is a schematic diagram of a memory cell and comparative logic, according to an example; and FIGS. 7B-C are tables illustrating various operating parameters, ranges, and outputs that may be considered when operating or designing the memory cell of FIG. 7A, according to an example.

DETAILED DESCRIPTION OF THE DRAWINGS a) Magnetic Memory Bits

Figure 1A:
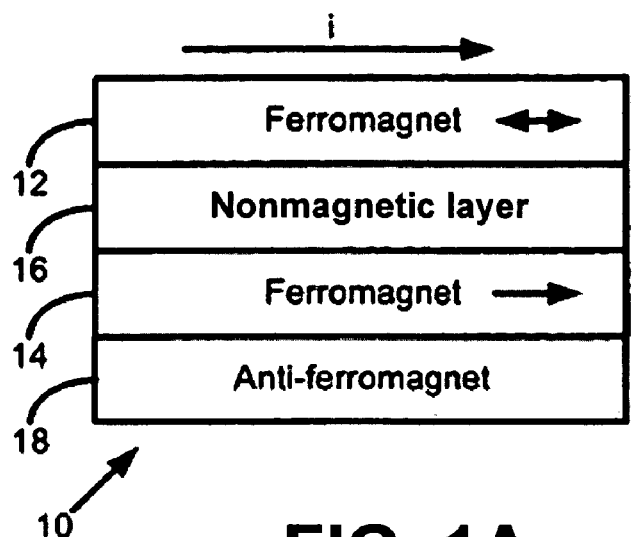
FIG. 1A is a schematic diagram of the layers of a prior art spin valve, according to an example.
Figure 1B:
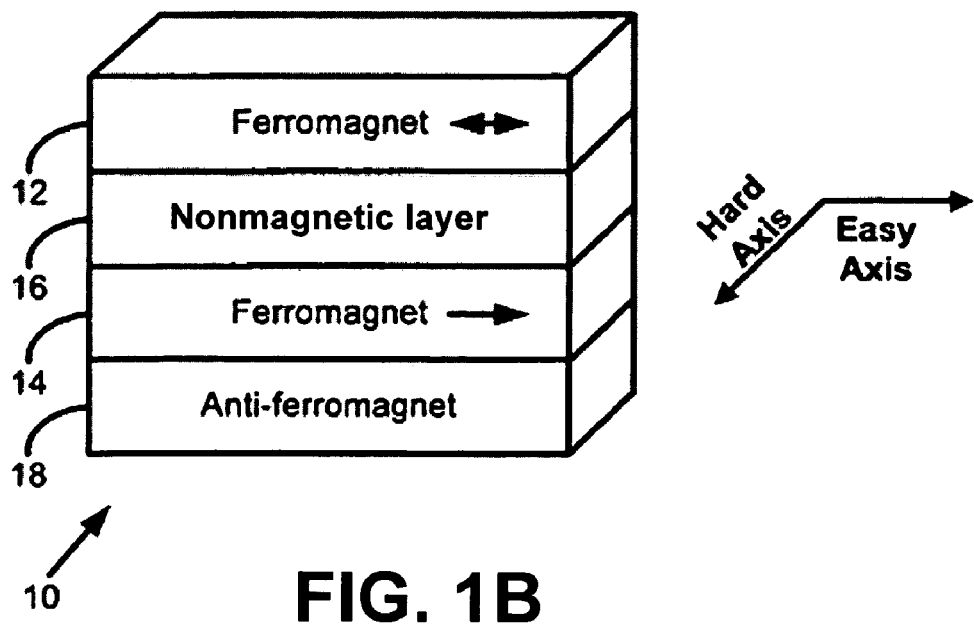
FIG. 1B is a three dimensional view of a prior art spin valve, according to an example.
Figure 2:
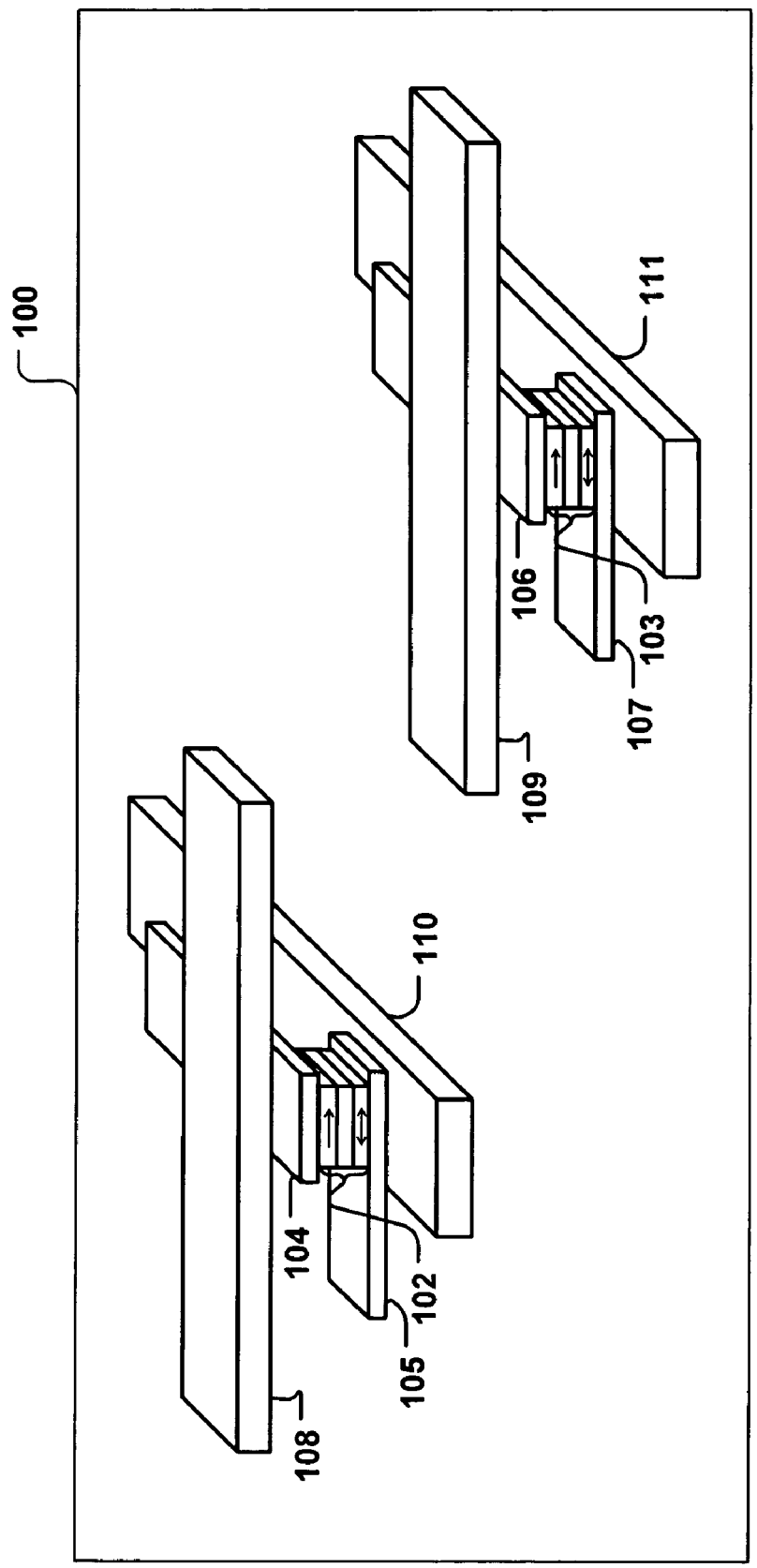
FIG. 2 is a three dimensional view of a memory cell that includes two spin valves and conducting lines for reading and writing, according to an example.

Referring to the drawings, FIG. 2 generally depicts a magnetic memory cell 100 with a separate read and write architecture. Magnetoresistive memory bits 102, 103 are shown as tri-layer elements each having a nonmagnetic spacer layer sandwiched between two conducting magnetic layers. Although FIG. 2 shows the nonmagnetic and conducting layers as single layers, these layers (i.e., the "pinned" and free "layers") may be made up of multiple layers of magnetic and non-magnetic material. Each magnetic layer of the bits 102, 103 has a magnetization direction. In FIG. 2, the top magnetic layers are shown with a single headed arrow indicating that the magnetization directions of the top magnetic layers do not change during operation of the cell 100. Thus, the top magnetic layers are known as reference, or pinned layers. The bottom magnetic layers are shown with double headed arrows indicating that the magnetization directions of the bottom magnetic layers can be inverted during operation of the cell. Thus, the bottom magnetic layers are known as storage, or free layers. As one skilled in the art will recognize, the orientation of the layers can be altered without eliminating the usefulness of the bits 102, 103.

A read line 104 is coupled to a first side of the bit 102 and a read line 105 is coupled to a second side of the bit 102. The two read lines are arranged such that a voltage difference between the read line 104 and the read line 105 will generate a current flowing through the layers of the bit 102. Similar to the bit 102, the bit 103 is sandwiched between a read line 106 and a read line 107. Depending on a memory's architecture of which the cell 100 is to be located in, and how the cell 100 is to be read or written, any of the read lines 104-107 may be coupled together in a variety of configurations. The read line 104 may run perpendicular to the read line 105 and the read line 106 may run perpendicular to the read line 107, for example. However, as one skilled in the art will understand, this arrangement is not necessary. For example, in alternative examples, the read line 105 does not run perpendicular to the read line 104, but rather terminates at a ground after passing through a select transistor (not shown).

A write line 108 is shown above the read line 104 and a write line 109 is shown above the read line 106. The write lines 108, 109 are each respectively separated from the read lines 104, 106 and from the rest of the cell 100 by a first insulative spacer (not shown). The write line 108 is arranged near the bit 102 such that a current passing through the write line 108 creates a magnetic field that acts on the bit 102. Similarly, the write line 109 is located near the bit 103 for creating a magnetic field that acts on the bit 103.

Additional write lines 110, 111 are respectively shown below the read lines 105, 107. The write lines 110, 111 are each separated from the read lines 105, 107 by a second insulative spacer (not shown). Similar to the write lines 108, 109, the write lines 110, 111 are respectively arranged near the bits 102, 103 so that a current passing through the write line 110 creates a magnetic field that acts on the bit 102 and a current passing through the write line 111 creates a magnetic field that acts on the bit 103. The write lines 108, 109 are generally arranged to run perpendicular to the write lines 110, 111. However, as one skilled in the art will understand, this arrangement is not necessary.

A logical state of the cell 100 depends upon the relative orientation of the magnetization directions of the magnetic layers of the bits 102, 103. Thus, the logical state of the cell 100 is set by orientating the magnetization layers. A first current passing through the write line 108 and a second current passing through the write line 110 create a combined magnetic field. The combined magnetic field acts on the bit 102 to invert the orientation of the magnetization direction of the free layer of the bit 102. Similarly, a third current passing through the write line 109 and a fourth current passing through the write line 111 create a combined magnetic field, which acts on the bit 103 to invert the orientation of the magnetization direction of the free layer of the bit 103.

To determine the logical state of the cell 100, which will be described in more detail below, a first voltage difference is created between the read lines 104, 105 and a second voltage difference is created between the read lines 106, 107. The first voltage difference results in a first tunneling current passing perpendicularly through the layers of the bit 102. Similarly, the second voltage difference produces a second tunneling current, which perpendicularly passes through the layers of the bit 103. The value of the first and second tunneling currents is indicative of the logical state of the cell 100.

The arrangement shown in FIG. 2 may be most applicable to bits with a high top to bottom resistivity such as magnetic tunnel junctions (MTJs). In an additional example, such as where the spacer layer of each of the bits 102, 103 is a conductive layer, the read lines 105, 106 (or the read lines 104, 106) may each be coupled with bit ends so that a read current flows along the easy axis of the bits 102, 103. Such sense currents may run through the conductive layers of the bits 102, 103. These currents may each terminate at a ground after passing through select transistors. In this case, the values of these sense currents are indicative of the logical state of the cell 100.

b) Magnetic Switching Process

In a magnetoresistive bit with a pair of magnetic layers, an orientation of the bit is determinable from the magnetization directions of the magnetic layers. The orientation may be toggled by switching (or inverting) the magnetization direction of one of the magnetic layers. Typically, when the storage and reference layers of a bit have magnetization directions that are in the same direction, the orientation of the bit is referred to as a parallel orientation. When the storage and reference layers are in the opposite direction, the orientation of the bit is referred to as an antiparallel orientation.

Figure 3:
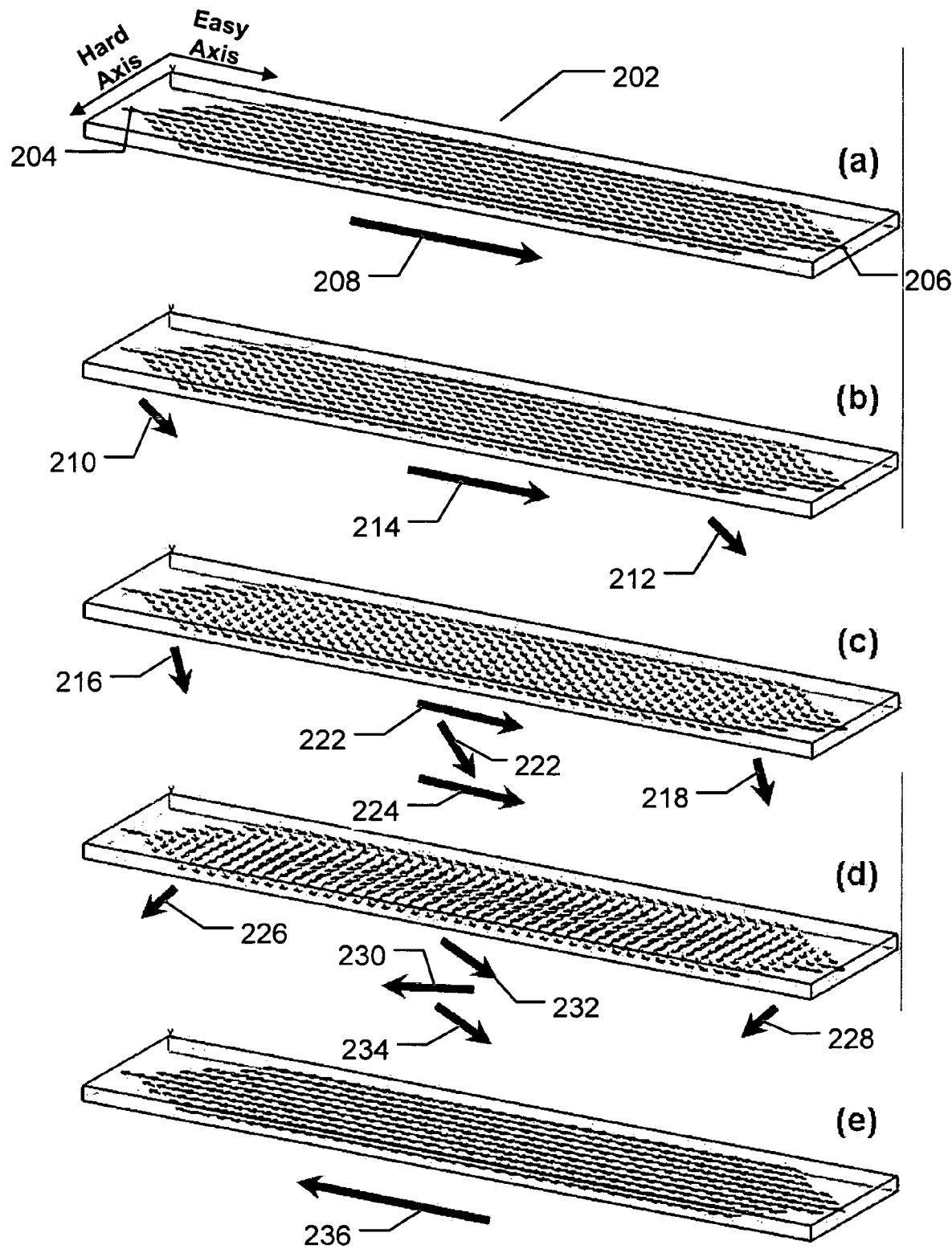
FIG. 3 is a sequential diagram of a magnetic switching process in a magnetic layer, according to an example.

Referring to FIG. 3, a series of frames chronicle a finite analysis of a magnetic switching process in a magnetic layer of a magnetoresistive bit in a prophetic example. The magnetic layer may be a storage layer, for example. In general, the series shows that the switching process involves a coordinated rotation (or reversal) of elemental magnetization directions within the magnetic layer.

Looking first at Frame (a), a magnetic layer 202 is shown as an elongated element with tapered bit ends. For convenience, the bit ends are labeled a first bit end 204 and a second bit end 206. An easy-axis (long-axis) of the magnetic layer 202 is shown running parallel to the elongation of the magnetic layer 202. A hard-axis (short-axis) is aligned in the plane of the magnetic layer 202 and runs perpendicular to the easy-axis. Within magnetic layer 202, elemental magnetization directions are shown as small arrows pointing along the easy-axis toward the second bit end 206. Magnetic exchange between the bit ends and the body of the bit would tend to make the magnetization uniform and unidirectional. (Magnetization exchange is the ferromagnetic exchange that tends to magnetize a magnetic domain of an ensemble of atoms in a given direction.)

A summary arrow 208 shows a composite magnetization direction of the magnetic layer 202 pointing along the easy-axis toward the second bit end 206. The uniform magnetization along the easy-axis as shown in Frame (a), may cause a magnetoresitive bit to be in a first orientation, for example.

Frames (b), (c), (d), and (e) represent the magnetic layer 202 in sequential scenes of a switching process. Thus, in parallel fashion, the first bit end 204 is the leftmost end of the magnetic layer in each frame, and the second bit end 206 is the rightmost end of the magnetic layer in each frame.

Jumping to Frame (e), the final frame, elemental magnetization directions are shown pointing along the easy-axis toward the first bit end 204. Frame (e) summary arrow 236 shows a generalized magnetization direction pointing in the opposite direction of the Frame (a) summary arrow 208. The uniform magnetization along the easy-axis as shown in Frame (e) is indicative of a second orientation. Thus, the objective of a switching process is to switch the direction of the magnetization layer 202 from the first orientation to the second orientation. Frames (b), (c), and (d) give further detail of the switching process.

In Frame (b), the elemental magnetization directions as shown by small arrows in the magnetic layer are no longer uniform across the entire magnetic layer. Specifically, elemental magnetization directions at the bit ends have begun to rotate clockwise toward the hard-axis. However, elemental magnetization directions in the elongated portion of the magnetic layer continue to point toward the second bit end 206. Frame (b) summary arrows 210, 212, and 214 mirror the elemental magnetization. In Frame (b), it can be seen that the switching process is initiated in the bit ends 204 and 206.

In Frame (c), the elemental magnetization directions show further rotation. Frame (c) summary arrows 216-224 mirror the rotation of the elemental magnetization directions. The bit end summary arrows 216 and 218 indicate further rotation of elemental magnetization directions at the bit ends 204 and 206. A center of the elongated portion of the magnetic layer has begun to rotate clockwise as shown by the center summary arrow 220. The edge summary arrows 222 and 224 show little rotation and indicate that elemental magnetization directions along edges of the elongated portion continue to substantial point toward the second bit end 206.

In Frame (d), bit end summary arrows 226 and 228 indicate continued rotation of elemental magnetization directions in the bit ends 204 and 206. The center of the elongated portion continues to rotate as shown by summary arrow 230. Edge summary arrows 232 and 234 indicate that elemental magnetization directions along the edges has begun to rotate in earnest.

Finally, Frame (e) shows a completed rotation and reformation of the uniformity of elemental magnetization directions across the magnetic layer. FIG. 3 in general shows how switching of the magnetization direction of the magnetic layer is initiated in the bit ends, continues through the center of the layer, and completes with reversal of the edges.

Although each intermediate frame (b), (c), (d) include elemental magnetization directions in several different directions, composite magnetization directions can be calculated through, for instance, an elemental average. In an alternative example, the composite magnetization directions for the frames are shown by the center summary arrows 214, 220, and 230.

Switching the magnetic layer from the second orientation to the first orientation involves a mirror-image procedure as switching from the first orientation to the second orientations. FIG. 3 is intended to serve as an example of a switching process and should not be seen as limiting. In addition, it should be understood that a variety of GMR based spin valves, or other type of magnetoresistive memory bits, may be used in a memory cell.

c) Memory Cell, Reading Scheme, and Memory Architecture

Returning now to FIG. 2, the cell 100 is configured to store a logical state, which may be a binary value of 1 or 0, for example. When determining the logical state of the cell 100, the orientations (i.e., parallel or antiparallel) of the bits 102, 103 are compared to each other. If the bits 102, 103 share the same orientation, for example the bits 102, 103 are both in a parallel or an antiparallel orientation, the cell 100 is in a first logical state. If the magnetization bits 102, 103 are in different orientations, for example, the bit 102 is in a parallel state and the bit 103 is in an antiparallel state, the cell 100 is in a second logical state.

An assignment of a binary datum may be made to the first and second logical states. For example, when the bits 102, 103 share the same orientation, the first logical state may be a binary value of 1. When the bits 102, 103 are in different orientations, the second logical state may be a binary value of 0. Other assignments are possible.

Generally speaking, when a bit is in a parallel orientation, a resistance of the bit is at a minimum value and when the bit is in an antiparallel orientation, the resistance of the bit is at a maximum value. A variety of signals may be applied to a particular bit within a cell to determine which resistive state the cell is in. For example, in FIG. 2, if the bit 102 is in a parallel orientation, a voltage applied at the read lines 104, 105 will produce a maximum amount of current. In an antiparallel orientation, the same voltage applied at the read lines 104, 105 will produce a minimum amount of current. Similarly, if a current is applied to the read lines 104, 105, a voltage across the read lines 104, 105 will be maximum for an antiparallel state and minimum for a parallel state.

The change in resistance may depend on the type of bit that is included in a memory cell. A 20% change in resistance, for example, may be observed when the resistance of a MTJ based magnetoresistive bit is changed from parallel to antiparallel, or vice versa. In some examples, a 30% change in resistance may occur. If other types of magnetoresistive bits are used, the resistance change may be larger or smaller. For example, the resistance change may be as large as 100% or larger, or as small as 2%.

Figure 4B:
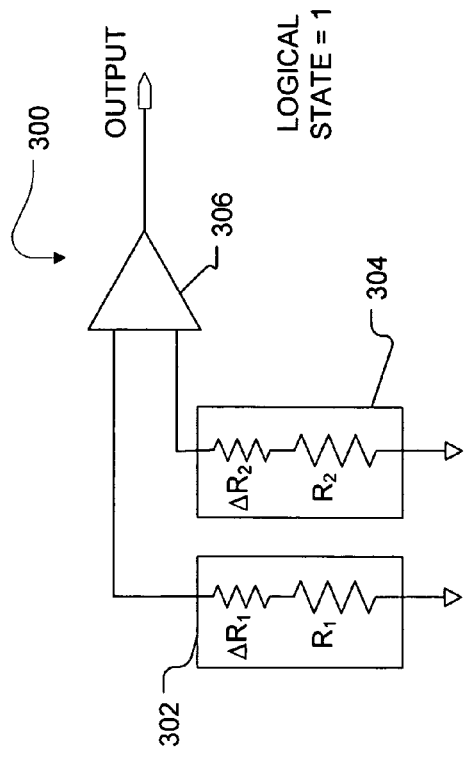
FIGS. 4A-D are schematic diagrams showing logical states for various orientations of two memory bits within a magnetic memory cell, according to an example.
Figure 4A:
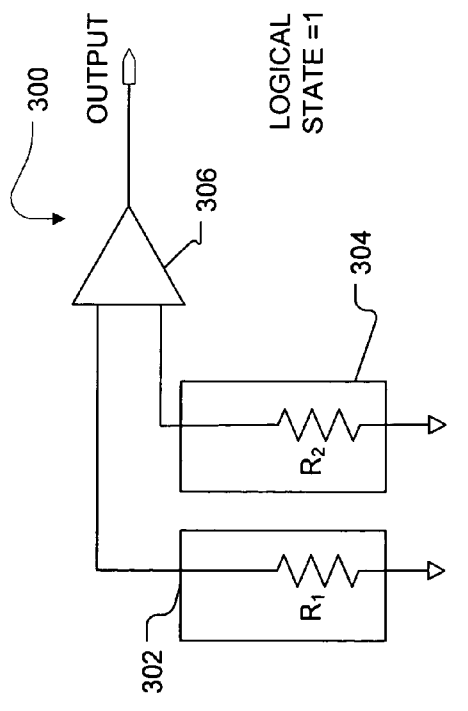
Figure 4D:
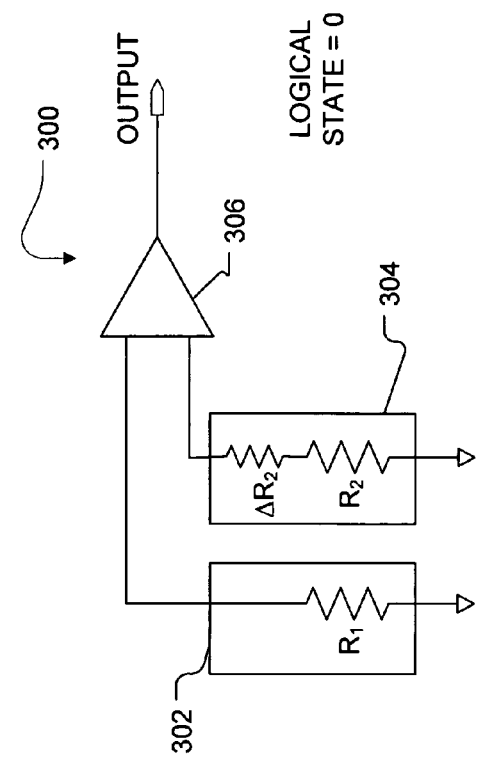
Figure 4C:
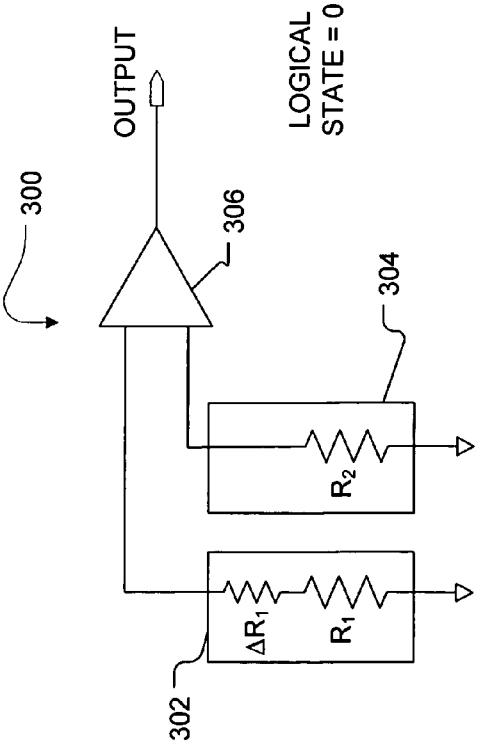

FIGS. 4A-D show various schematic diagrams depicting the logical state of a magnetic memory cell 300 that comprises two magnetoresistive memory bits 302, 304. FIGS. 4A and 4B show the cell 300 in the first logical state (a binary value of 1). FIGS. 4C and 4D, on the other hand, show the cell 300 in the second logical state (a binary value of 0). In a parallel orientation, the bit 302 has a resistance $R_1$ and the bit 304 has a resistance $R_2$. In an antiparallel orientation, the bit 302 has a resistance $R_1+\Delta R_1$ and the bit 304 has a resistance $R_2+\Delta R_2$. Assuming that $R_1=R_2$ and $\Delta R_1=\Delta R_2$ (or are similar in value), the overall resistances of the bits 302, 304 may be used to determine a logical state of the cell 30. A comparator 306, for example, which is shown coupled to the bits 302, 304, may produce an output indicative of the first and second logical states. Other comparative logic, including an example below, may also be used to compare a resistance of the bit 302 to a resistance of the bit 304.

Practically speaking, $R_1$ and $R_2$ as well as $\Delta R_1$ and $\Delta R_2$, may not be precisely equal to each other. Instead, and in order to incorporate inherent resistance differences, $R_1$ and $R_2$ and/or $\Delta R_1$ and $\Delta R_2$ may be within an equivalent resistance range. In many semiconductor processes, processing variations may cause a slight difference in the resistances across a given chip. Nevertheless, such a difference may be accommodated by using an equivalent resistance range that has a tolerance, such as ±10%, for example. In the example of FIGS. 4A-D, the comparator 306 may use the equivalent resistance range when determining the equivalency of the bits 302, 304.

FIG. 5A shows a method 400 of operating a memory cell that includes at least two magnetoresistive memory bits. In contrast to memory cell architectures that use a high/low scheme to determine a logical state, the method 400 may be applied to a memory cell without relying on an external reference resistance. Instead, the orientations of the bits within the cell are compared to each other, determining a logical state of the cell.

At block 402, two memory bits are provided. At block 404, a resistance of the first bit is measured. Likewise, at block 406, a resistance of the second bit is measured. It should be understood that the resistances of the first and second bits may be measured in a variety of ways, such as those described above (i.e., by applying a current or a voltage to a respective bit). Moreover, in some examples the resistance may be indirectly measured. For example, a current signal, which is produced as a result of applying a voltage signal across a bit, may be indicative of a resistance.

At block 408, the resistances (or equivalents thereof) of the first and second bits are compared. If the first and second bits have an equivalent resistance, this may indicate the first logical state. On the other hand, if the resistances are not equivalent, this may indicate the second logical state. As described above, the equivalent resistance may be more generally referred to as an equivalent resistance range to accommodate inherent variations in resistance.

FIG. 5B shows an equivalent resistance range that a comparator or other comparative logic may use to determine an equivalent range of the memory cell 300 shown in FIGS. 4A-D. FIG. 5B shows four ranges, any of which may be used to determine if the bits 302, 304 are within an equivalent resistance range. For example, a range 410 and a range 412 may be used to determine if the bits 302, 304 are within 10% of each other. Additionally or alternatively, a range 414 and a range 416 may also be used to determine if the bits 302, 304 are also within 10% of each other. A variety of other ranges may be used to derive an equivalent resistance range.

Returning to FIG. 5A, the method 400 may also include block 418, which may output a datum indicative of the first and second logical status. As described above the datum may be a binary datum, such as 0 or 1.

Although the above primarily describes reading a memory cell, and in particular the cell 300, it should be understood that a memory cell may be written in a variety of ways. For example, to write the bits 302, 304 so that the cell 300 is in the first logical state, a magnetic field may be applied to both the bits 302, 304. The applied magnetic field may be applied so that both bits share the same orientation. To bring the memory cell into the second logical state, a magnetic field may be applied to a single bit, such as the bit 302 or the bit 304 so that either bit's orientation changes with respect to the other bit. Alternatively, opposite magnetic fields may be respectively applied to the bits 302, 304, ensuring that the bits 302, 304 will have opposite orientations. A variety of other writing methods are possible.

Figure 6:
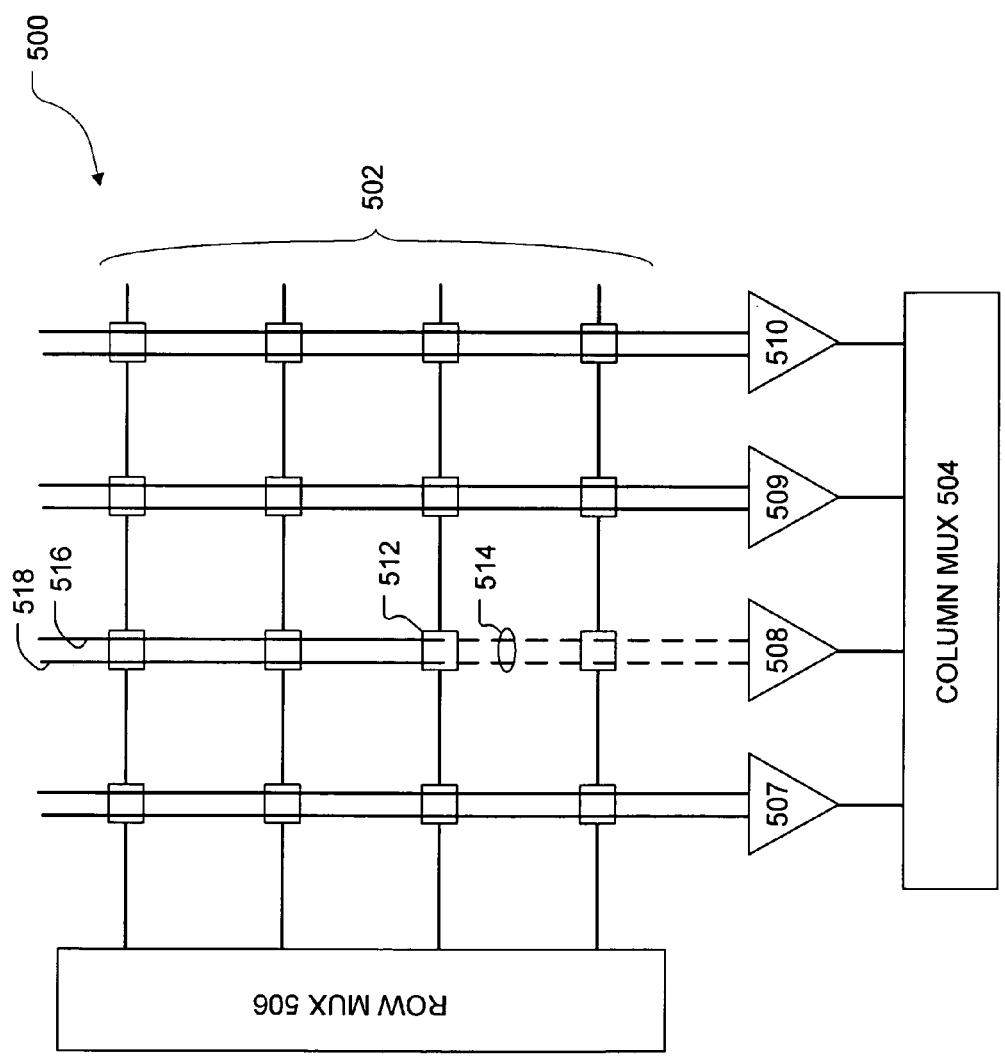
FIG. 6 is a block diagram of a memory comprising memory cells that each include at least two memory bits, according to an example.

Furthermore, a variety of memory architectures may be configured to use memory cells that include two bits. FIG. 6 shows an example memory 500 that comprises an example read architecture. The memory 500 comprises a plurality of memory cells 502 (that each include two magnetoresistive memory bits for storing a logical state), a column multiplexer (MUX) 504, a row MUX 506, and comparators 507-510.

To read a memory cell, the comparators 507-510 are each coupled to a column of the memory 500. The column and row MUXes 504, 506 may be used together to select a cell that is to be read (in a similar manner to a static random access memory (SRAM), for example).

When a memory cell is selected, it may have a communication path to one of the comparators 507-510. For example, FIG. 6 shows a magnetic memory cell 512 coupled to the comparator 507 via a communication path 514. The communication path comprises two data lines 516, 518, where each of the data lines 516, 518 is coupled to one of the bits within the memory cell 512. By comparing the orientations of the bits within the memory cell 512, the comparator 508 may determine the logical state of the cell 512. The column and row MUXes 504, 506 may also select other cells to be read. Consequently, the comparator 508 may read other cells that share a column with the cell 512.

Although not shown, a variety of similar architectures may be used to write any cell within the memory 500. The memory 500 may also be configured as a write architecture or a separate write architecture may be implemented. As noted above, such an architecture should allow the bits within a given memory cell to share the same orientation and have different orientations. Moreover, other methods of selection are possible and the example of FIG. 6 should not be viewed as limiting.

d) Example Architecture for Establishing an Equivalent Voltage Range

As described above, an equivalent resistance range may be used to determine the logical state of both bits within a memory cell. The equivalent resistance range may prevent inherent variations in resistance from resulting in an erroneous logical state of a memory cell. The equivalent resistance range may also take the form of an equivalent current or voltage range. Described below is a memory cell that uses an equivalent voltage range to determine the logical state of a memory cell.

FIG. 7A is a schematic diagram of an example memory cell 600 and comparative logic 601. The cell 600 includes memory bits 602, 604 coupled together at a node 606. The voltage, $V_M$, at the node 606 is indicative of the orientations of the bits 602, 604. When $V_M$ is within an equivalent voltage range, $V_L \leq V_M \leq V_U$ (where $V_L$ and $V_U$ are respective upper and lower limits of the equivalent voltage range), a first logical state is stored in the cell 600. On the other hand, when $V_M$ is outside of the equivalent voltage range, a second logical state is stored in the cell 600.

The comparative logic 601 that may be included in the cell 600 comprises comparators 608, 610, logical AND gate 612, and resistances 613-616 (shown as resistors). A first input of the comparator 608 is coupled to the resistors 613, 615 and a second input of the comparator 608 is coupled to the bits 602, 604. Similarly, a first input of the comparator 610 is coupled to the resistors 614, 616 and a second input of the comparator 610 is also coupled to the bits 602, 604. Outputs of the comparators 608, 610 are coupled to inputs of the AND gate 612. The AND gate 612 produces an output which is indicative of the logical state of the cell 600.

The bit 602 and the resistors 613, 614 are coupled to receive a voltage bias ($V_{BIAS}$). The bit 604 and the resistors 615, 616, on the other hand, are coupled to a ground or common terminal, which may provide a ground or zero voltage bias. The bit 604 and the resistor 615, 616 are not limited to only receiving a zero voltage bias, however. Generally speaking, the resistors 613, 615 act as a voltage divider for establishing the lower limit, $V_L$, and the resistors 614, 616 establish the upper limit, $V_U$, of the equivalent resistance range.

FIG. 7B is a table that generally shows the logical states that the comparators 608, 610 and the AND gate 612 output for various orientations of the bits 602, 604. When both the bits 602, 604 share the same orientations, the AND gate 612 outputs the first logical state (a binary value of 1). When the bits 602, 604 have opposite orientations, the AND gate 612 outputs the second logical state (a binary value of 0).

The type of bit and the change in resistance between parallel and antiparallel orientation (referred to as ΔBIT) may affect the equivalent voltage range and the possible values of $V_M$. Inherent variations in the bits 602, 604 (e.g., variations in processing or resistance changes during operation) may also affect the equivalent voltage range (referred to as % VAR).

To determine the logical state of the cell 600, $V_M$ will either be within the equivalent voltage range or not. $V_M$ will vary as orientations of the bits 602, 604 vary. This is because as the orientations vary, the resistance of the bits 602, 604 will vary. When the bits 602, 604 share the same orientation, a voltage drop across both the bits 602, 604 is symmetric at the node 606. However, when the bits 602, 604 have opposite orientations, the voltage drop is asymmetric.

When the voltage drop across the bits 602, 604 is symmetric, $V_M$ should be about equal to $V_{BIAS}/2$ or within the equivalent voltage range of $V_L \leq V_M \leq V_U$. When the voltage drop is asymmetric $V_M$ should be outside of the equivalent voltage range. The magnitude of $V_M$ when the bits 602, 604 are asymmetric depends on the magnitude of ΔBIT. For example, a larger ΔBIT (i.e., a larger changes in resistances) will produce a larger range of values for $V_M$.

FIG. 7C is table that shows various ranges of values for $V_M$. The first row of FIG. 7C shows a ΔBIT of 20%. When the bits 602, 604 share the same orientation $V_M$ is about equal to $V_{BIAS}/2$ (referred to as MID). However, when the bits 602, 604 are in opposite orientations, $V_M$ will be either greater than or less than $V_{BIAS}/2$. For example, if the bit 602 is in a parallel orientation and the bit 604 is in an antiparallel orientation, $V_M$ will be about equal to $0.55*V_{BIAS}$ (referred to as HIGH). On the other hand, if the bit 602 is in an antiparallel orientation and the bit 604 is in a parallel orientation, $V_M$ will be about equal to $0.45*V_{BIAS}$ (referred to as LOW).

In contrast to the first row, the second row of FIG. 7C shows a ΔBIT of 50%. Accordingly, $V_M$ could have possible values of $0.6*V_{BIAS}$ (HIGH) and $0.4*V_{BIAS}$ (LOW) when the bits 602, 604 have different orientations. Other ΔBITs are possible, which may produce a variety of LOW, HIGH, and possibly MID voltage values for $V_M$.

As described above, to determine the logical state of the cell 600, the comparative logic 601 uses the two voltages, $V_L$ and $V_U$, to establish the equivalent voltage range, which, as described above, may be used to accommodate inherent resistance variations. The resistors 613, 615 may be chosen so as to set the lower limit, $V_L$. The resistors 614, 616, on the other hand, may be chosen to set the upper limit, $V_U$. To determine if $V_M$ is within the equivalent voltage range, the comparator 608 produces an output indicative of whether $V_M$ is greater than (or equal to) $V_L$ and the comparator 610 produces an output indicative of whether $V_M$ is less than (or equal to) $V_U$.

To establish the lower and upper limits, $V_L$, $V_U$, the resistors 614, 615 may have a resistance $R_0$; the resistor 613 may have a resistance $R_L$; and the resistor 616 may have a resistance $R_U$. Accordingly, $R_L$ and $R_I$ may be used to set the upper and lower voltage limits where:

$$V_L = V_{BIAS} * (1 + R_L/R_0)^{-1}$$

$$V_U = V_{BIAS} * (1 + R_0/R_U)^{-1}$$

FIG. 7D is a table that shows example variations (% VAR) in the resistances of the bits 602, 604 and possible resistance choices for $R_L$ and $R_U$ that may be used to expand the equivalent voltage range. FIG. 7D demonstrates that by proper choice of $V_L$ and $V_U$ (via $R_L$ and $R_U$) resistance variations may be accommodated.

It should be noted that the comparative logic 601 may be located within the cell 600, or it may be used by multiple cells. For example, similar to the comparators 507-510 shown in FIG. 6, the comparative logic 601 may be couple to a column MUX, where each cell in a column shares the comparative logic 601. Other scenarios are possible.

e) Conclusion

A variety of examples have been described above. More generally, those skilled in the art will understand that changes and modifications may be made to these examples without departing from the true scope and spirit of the present invention, which is defined by the claims. Thus, for example, the memory cell should not be limited to the type of bit or the number of bits that the cell comprises. Moreover, the illustrated memory cells may be configured in a variety of ways in order to read or sense the orientations of the bits within a cell. In addition, although magnetic based memories are illustrated, it is contemplated that other non-volatile memories may also benefit from the same/different sensing scheme described herein. Finally, device design, processing, and test conditions all affect magnetization switching characteristics and are therefore should be considered.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A method of determining a logic state of a memory cell, comprising:
   providing a memory cell that includes a first magnetoresistive memory bit and a second magnetoresistive memory bit;
   determining an orientation of the first bit by comparing a first voltage at the first bit to a third voltage bias:
   determining an orientation of the second bit by comparing a second voltage at the second bit to a fourth voltage bias: and
   applying the determined orientations of the first and second bits to a logical AND gate, wherein the logical AND gate outputs a binary datum indicative of whether the voltage at the first and second bits is within an equivalent voltage range established by the third and fourth voltage biases.

2. The method as in claim 1, wherein the first and second bits each comprise a magnetic tunneling junction device.

3. The method as in claim 1, wherein determining the orientation of the first and second bits comprises measuring a resistance of the first bit and a resistance of the second bit, and wherein applying the orientation of the first and second bits to a logical AND gate comprises comparing the resistance of the first bit to the resistance of the second bit.

4. The method as in claim 3, further comprising writing the memory cell by using an applied magnetic field to change a resistance value of the first bit.

5. The method as in claim 3, further comprising writing the memory cell by using an applied magnetic to change a resistance value of the first bit and a resistance value of the second bit.

6. The method as in claim 3, wherein comparing the resistance of the first bit to the resistance of the second bit comprises determining if the first and second bits are within an equivalent resistance range.

7. The method as in claim 6, wherein the equivalent resistance range comprises ±10% of a maximum resistance measurement of at least one of the first and second bits and ±10% of a minimum resistance measurement of at least one of the first and second bits.

8. A memory, comprising:
   a first magnetoresistive memory bit comprising first and second terminals, wherein the first terminal of the first bit is for receiving a first voltage bias;
   a second magnetoresistive memory bit comprising first and second terminals, wherein the first terminal of the second bit is for receiving a second voltage bias; and
   comparative logic coupled to the second terminal of the first bit and the second terminal of the second bit, wherein the comparative logic is configured to determine a logical state of the first and second bits by measuring a voltage at the second terminals of the first and second bits, wherein the comparative logic is configured to determine a binary datum based on the orientations of the first and second bits and wherein the comparative logic comprises:
   a first comparator having first and second inputs respectively coupled to the second terminal of the first bit and a third voltage bias:
   a second comparator having first and second inputs respectively coupled to the second terminal of the second bit and a fourth voltage bias: and
   a logical AND gate having first and second inputs coupled to outputs of the first and second comparators, wherein the AND gate, in operation, outputs a binary datum indicative of whether the voltage at the second terminals of the first and second bits is within an equivalent voltage range established by the third and fourth voltage biases.

9. The memory as in claim 8, further comprising a plurality of memory cells, wherein the first and second bits are positioned within a first memory cell selected from the plurality of memory cells.

10. The memory as in claim 9, wherein the comparative logic is positioned within the first memory cell.

11. The memory as in claim 9, wherein the comparative logic is coupled to a portion of the plurality of memory cells, and wherein the portion of the plurality of memory cells share the comparative logic.

12. The memory as in claim 8, wherein the comparative logic, in operation, determines if the first and second bits are in an equivalent voltage range.

13. The memory as in claim 8, further comprising:
   a first voltage divider coupled between the first and second voltage biases, wherein the first voltage divider establishes the third voltage bias; and
   a second voltage divider coupled between the first and second voltage biases, wherein the second voltage divider establishes the fourth voltage bias.

14. A memory, comprising:
   a first magnetoresistive memory bit comprising first and second terminals, wherein the first terminal of the first bit is for receiving a first voltage bias:
   a second magnetoresistive memory bit comprising first and second terminals, wherein the first terminal of the second bit is for receiving a second voltage bias: and
   comparative logic coupled to the second terminal of the first bit and the second terminal of the second bit, wherein the comparative logic comprises:
   a first comparator having first and second inputs respectively coupled to the second terminal of the first bit and a third voltage bias:
   a second comparator having first and second inputs respectively coupled to the second terminal of the second bit and a fourth voltage bias: and
   a logical AND gate having first and second inputs coupled to outputs of the first and second comparators, wherein the AND gate, in operation, outputs a binary datum indicative of whether the voltage at the second terminals of the first and second bits is within an equivalent voltage range established by the third and fourth voltage biases.

* * * * *